(12) United States Patent
Kurihara et al.

(10) Patent No.: US 6,248,400 B1
(45) Date of Patent: *Jun. 19, 2001

(54) VAPOR PHASE DIAMOND SYNTHESIS METHOD

(75) Inventors: Kazuaki Kurihara; Kenichi Sasaki; Tsukasa Itani; Shinobu Akashi, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/912,369

(22) Filed: Aug. 18, 1997

Related U.S. Application Data

(63) Continuation of application No. 08/524,150, filed on Aug. 17, 1995, now abandoned, which is a continuation of application No. 08/235,791, filed on Apr. 29, 1994, now abandoned.

(30) Foreign Application Priority Data

Aug. 12, 1993 (JP) ...................................... 5-200605

(51) Int. Cl.$^7$ .................................................. C23C 16/27
(52) U.S. Cl. ........................................ 427/249.8; 423/446
(58) Field of Search ............................ 117/929; 427/577, 427/249, 249.7, 249.8; 423/446

(56) References Cited

U.S. PATENT DOCUMENTS

| | | | |
|---|---|---|---|
| 5,087,434 | * 2/1992 | Frenklach et al. | 423/446 |
| 5,130,111 | * 7/1992 | Pryor | 423/446 |
| 5,264,071 | 11/1993 | Anthony et al. | 156/612 |
| 5,314,652 | 5/1994 | Simpson et al. | 264/81 |
| 5,403,399 | * 4/1995 | Kurihara et al. | 118/723 DC |

FOREIGN PATENT DOCUMENTS

| | | | |
|---|---|---|---|
| 62-278195 | * 12/1987 | (JP) | 423/446 |
| 3-80191 | * 4/1991 | (JP) | 423/446 |
| 3-936540 | * 4/1991 | (JP) | 423/446 |
| 4-37693 | 2/1992 | (JP) . | |
| 4-228497 | 8/1992 | (JP) . | |
| 6-100398 | 4/1994 | (JP) . | |
| 6-191990 | 7/1994 | (JP) . | |

* cited by examiner

Primary Examiner—Stuart L. Hendrickson
(74) Attorney, Agent, or Firm—Armstrong, Westerman, Hattori, McLeland & Naughton LLP

(57) ABSTRACT

A DC plasma jet CVD process having a high film deposition rate is employed. A material having low adhesion with diamond is used for a substrate. A diamond film automatically peels from the substrate at the time of cooling. Gas is recycled because gas utilization efficiency is low. In this case, deposition of carbon can be prevented by setting a gas flow velocity to at least 5 m/s in the proximity of an anodic point.

6 Claims, 9 Drawing Sheets

VAPOR PHASE DIAMOND SYNTHESIS METHOD

This application is a continuation application of Ser. No. 08/524,150 filed Aug. 17, 1995, now abandoned, which is a continuation application of Ser. No. 08/235,791 filed Apr. 29, 1994, both now abandoned.

BACKGROUND OF THE INVENTION

1. Field of the Invention

This invention relates to a method and apparatus for vapor phase synthesis of diamond. More particularly, it relates to a method and apparatus for producing a diaphragm of diamond which is used for a speaker or the like.

2. Description of the Related Art

Since diamond has an extremely high Young's modulus and a small specific gravity, its propagation speed of an acoustic wave is 18,000 m/s and this value is by far higher than those of other materials. Accordingly, diamond is an extremely excellent material for a diaphragm of a speaker, a headphone, a microphone, and so forth. Furthermore, a diamond film produced by vapor phase synthesis has a suitable internal loss irrespective of an extremely high propagation speed of the acoustic wave and in this sense, it is an ultimate material for a diaphragm.

Conventionally, the diamond diaphragm has been produced by the steps of depositing a diamond film on the surface of a substrate of Si, etc., shaped into the shape of a diaphragm (dome shape) by a hot filament assisted chemical vapor deposition (hereinafter referred to as HFCVD) and then removing the substrate by etching (for example, "Radio Technology", April, 1991, published by Radio Gijutsusha). FIG. 1 is a schematic view of a method of producing a diamond diaphram according to the conventional HFCVD. In drawing, reference numeral 1 denotes a diamond film; 2 is a Si substrate; 3 is a filament; 4 is a gas; and 5 is an exhaust system.

However, this method involves the following problems.

(1) The film deposition rate according to the HFCVD is as low as about 1 $\mu$m/hr, and an extended period of time is necessary to form the film.

(2) The arrangement of the filament and a support structure are extremely complicated because a diamond film having a uniform thickness must be deposited on a curved plane.

(3) The filament must be frequently changed due to its elongation and deterioration (carbonization), and the film deposition conditions are not stable, so that film quality is not constant.

(4) A step of removing the substrate by etching is necessary after the deposition of the diamond film, and this etching, too, requires a long time.

(5) The same number of dome-like Si substrates as the number of the diaphragms to be produced must be prepared.

(6) Gas efficiency for the vapor phase synthesis of diamond is as low as only several percents.

For the reasons described above, the conventional diamond diaphragm is very expensive, and producibility is also very low.

It is therefore an object of the present invention to provide a method and apparatus for vapor phase synthesis of diamond capable of solving the problems described above and economically producing the diamond diaphragm with a high producibility.

SUMMARY OF THE INVENTION

To accomplish the object described above, the present invention provides a method of producing a diamond shaped film which comprises the steps of preparing a substrate having a predetermined shape, depositing a diamond film onto the substrate by a DC plasma jet CVD process, and after the deposition of the film, cooling said substrate so as to automatically peel the diamond film from the substrate due to the difference of thermal expansion coefficients between diamond and the substrate during the cooling step.

When the diamond film to serve as the diaphragm of the speaker, etc., is produced according to the present invention by the DC plasma jet CVD process (refer to Japanese Unexamined Patent Publication (Kokai) No. 64-33096), the diamond film can be produced by far more economically in a shorter time with a reduced number of production steps but with a higher producibility than the conventional production method.

The DC plasma jet CVD process is a high speed synthesis method of a diamond film or powder in which a high temperature thermal plasma generated by D.C. arc discharge is discharged as a plasma jet from a torch nozzle, and this plasma jet is applied onto the substrate, by which a film deposition rate of some hundreds of microns per hour is attained. This method of depositing a diamond film makes it possible;

(1) to reduce the film deposition time to only one several tenth to one several hundredth of the HFCVD;

(2) to eliminate the necessity for the complicated works such as adjustment and replacement of the filament that have been required in the HFCVD, and to continuously produce large quantities of products, because this method jets the plasma jet from the plasma torch to the substrate; and (3) to shape the substrate into a concaved or convexed shape, so that a sound emission plane can be smoothed in the former case and a voice coil bobbin can be integrally synthesized in the latter.

When a material having low adhesion with diamond is used for at least the surface of the substrate, the diamond film automatically peels from the substrate due to the difference of thermal expansion coefficients between diamond and the substrate material when the substrate temperature is lowered after completion of the synthesis of diamond. Therefore, the peeling step can be eliminated, and the diamond film can be continuously formed by one substrate.

The material for at least the surface of the substrate is preferably such a material which has low bonding strength with diamond but has great thermal expansion coefficient and thermal conductivity. More specifically, those metals which are likely to form carbides, such as silicon, molybdenum, tungsten, etc., are not preferred because they have higher adhesion to diamond than other materials. Those metals which are likely to form a solid solution with carbon, such as iron, nickel, cobalt, etc., are not preferred, either, because they cannot easily form high quality diamond. Suitable examples are those metals which do not easily form compounds and solid solutions with carbon, such as copper, gold and platinum, and ceramic materials. A composite material such as superhard WC-C and a TiC-clad stainless steel are effective materials for the substrate. When the thickness of diamond film is great, the diamond film can peel from the substrate without cracks even when a metal which is likely to form a carbide, such as molybdenum, is used.

According to the present invention, there is provided a method for vapor phase synthesizing diamond which includes the steps of synthesizing diamond by a chemical vapor phase synthesis using a carbon compound as a starting gas, and recycling the gas after being used for the synthesis of diamond as a part of the starting gas.

In the synthesis of diamond by the DC plasma jet CVD process, argon and hydrogen are generally used as the plasma gas, and a few percents, on the basis of the total amount, of hydrocarbon gas such as methane gas is added as a carbon source. Since the efficiency of conversion from the hydrocarbon gas to diamond is only several percents, efficiency in utilization of the gas is extremely low. Accordingly, if the used gas is circulated for re-use, the hydrocarbon gas needs be supplied only in the amount corresponding to the amount of the carbon content consumed for the synthesis of diamond. Accordingly, the quantity of the used gas can be drastically reduced. The composition of hydrocarbons in the gas exhausted from the torch is different from the composition first supplied to the torch, but the influences due to the difference of the kind of hydrocarbons are small in the DC plasma jet CVD process.

Therefore, the gas consumption can be drastically reduced and the cost of the diamond synthesis can also be drastically reduced, by recycling and reusing the gas used for the vapor synthesis of diamond. This method can be effectively applied not only to the production of a diaphragm of the speaker, or the like, but also to plasma CVD of diamond, in general. However, this effect is particularly great in the DC plasma jet CVD because it uses greater quantity of gas than the method as shown in FIG. 1.

In the vapor phase synthesis of diamond using a DC plasma torch, an inert gas plus hydrogen are typically supplied to the plasma torch to generate a plasma, and diamond is synthesized by supplying a carbon compound to the plasma jet from outside the torch. When the gas is recycled, however, the inert gas, hydrogen and the carbon compounds (unreacted materials and reaction products) is mixed. Generally, therefore, they are supplied to the plasma torch in the form of the mixed gas without separation. The composition of this recycled gas somewhat deviates from the composition of the optimum feed gas. It is therefore preferred to analyze the composition and to supplement insufficient hydrogen, carbon compounds, etc., and feed them to the plasma torch as the starting gas. A gas chromatograph or a mass spectrometer is suitable for this composition analyzer, and the mass spectrometer is particularly suitable for continuous analysis.

When a starting gas containing a carbon compound is supplied to a plasma torch, carbon is deposited onto the surface of the anode of the plasma torch, so that stability of discharge drops and quality of the diamond film gets deteriorated. As a result of studies, the inventors of the present invention have found out, however, that the deposition of carbon can be prevented when a gas flow velocity is at least 5 m/s in the proximity of an anodic point of the DC plasma torch.

The present invention also provides an apparatus for vapor phase synthesis of diamond comprising a vacuum chamber, a DC plasma torch in said vacuum chamber, and a diamond deposition substrate opposing the plasma torch in said vacuum chamber, wherein the substrate has a shape in conformity with the shape of a product and is made of a material which is difficult to form a compound or a solid solution with carbon. The present invention further provides an apparatus for vapor phase synthesis of diamond comprising a vacuum chamber, a DC plasma torch in said vacuum chamber, a diamond deposition substrate opposing the plasma torch in said vacuum chamber, a system for supplying a feed gas for the plasma torch, a system for discharging a gas from the vacuum chamber and a recycling system for recycling the gas from the gas discharging system to the feed gas supplying system.

DESCRIPTION OF THE PREFERRED EMBODIMENTS

Figure 2:
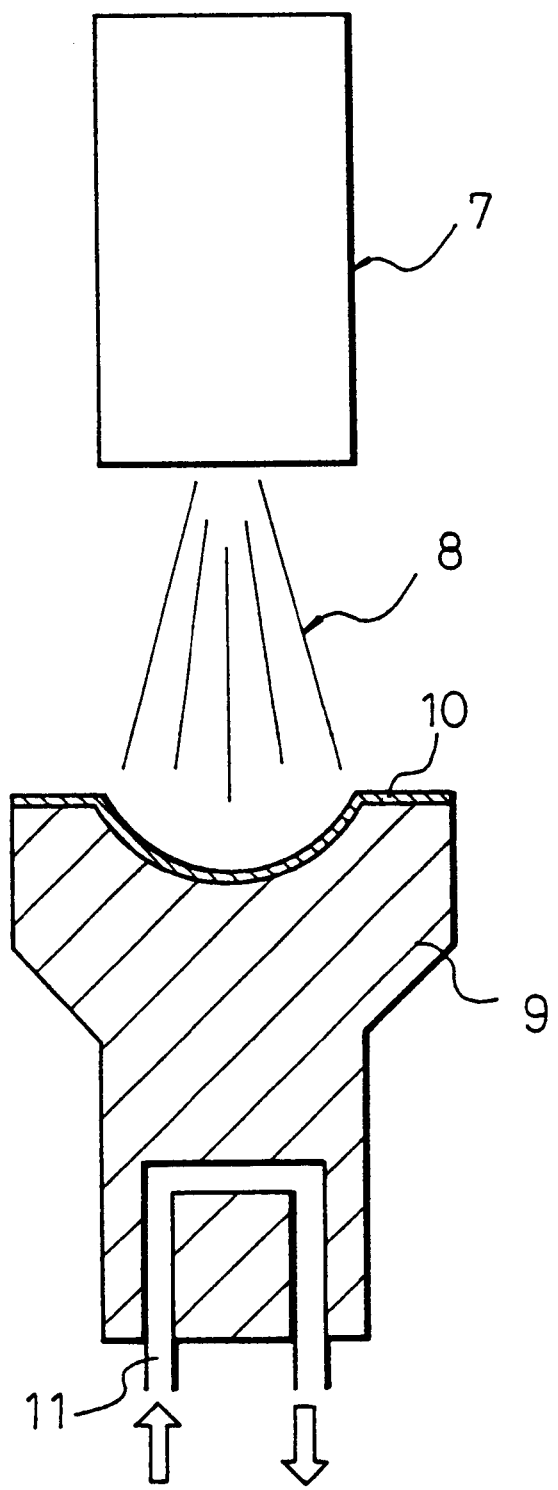
FIG. 2 is an explanatory view useful for explaining the principle of a plasma jet CVD process according to the present invention.

FIG. 2 is an explanatory view useful for explaining the principle of the diamond film formation method according to a plasma jet CVD process.

A plasma jet 8 containing carbon radicals is jetted from a plasma torch 7 and a diamond film 10 is deposited on a substrate 9. Since the plasma jet 8 has an extremely high temperature, the substrate 9 is cooled by cooling water 11. If the substrate is shaped into the shape of a desired product (such as a diaphragm of a speaker), the diamond film can be obtained in the shape of the product.

The present invention is particularly directed to the production of the diaphragm of the speaker, etc., by a DC plasma jet CVD process. As described already, the DC plasma jet CVD process is a method in which a high temperature thermal plasma is generated by D.C. arc discharge using the plasma torch 7, this thermal plasma is jetted from the nozzle of the plasma torch, and the diamond is synthesized onto the substrate at a high speed. This method can attain a film deposition rate of several hundreds of microns per hour.

When a material having a low adhesion with diamond is used for the substrate, the diamond film automatically peels off from the substrate at the time of cooling after the film deposition, and production efficiency can be remarkably improved.

Figure 3:
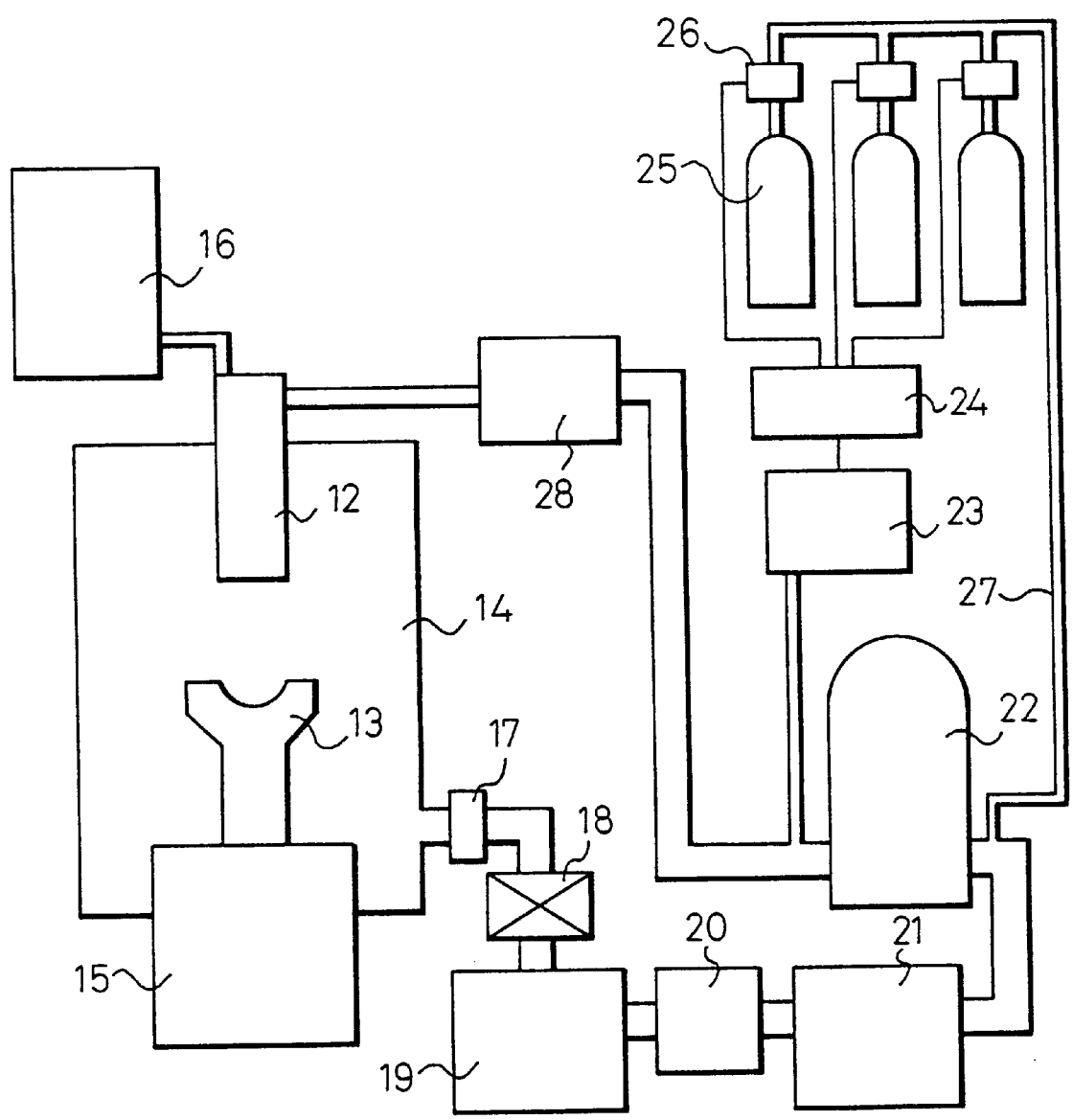
FIG. 3 shows a plasma jet CVD apparatus inclusive of a gas circulation system.

FIG. 3 shows the construction of a plasma jet CVD apparatus having a gas circulation system.

In FIG. 3, reference numeral 12 denotes a plasma torch; 13 is a substrate; 14 is a chamber; 15 is a substrate rotation/movement mechanism; and 16 is a power supply. Though the substrate 13 may be fixed, the substrate rotation/movement mechanism 15 is preferably provided because the uniformity of the film thickness and film quality can be improved if the substrate can rotate and move during the film deposition process.

The chamber 14 is evacuated by a vacuum pump 19 through a filter 17 and a valve 18, and this exhaust gas is compressed by a compressor 21 through an oil trap 20 and is then stored in a tank 22.

A dry pump is preferably used as the vacuum pump so as to prevent the mixing of the oil. The exhaust gas must be passed through the filter 17 because diamond powder, etc. are introduced into the exhaust gas from the chamber 14. It is advisable to dispose the compressor 21 and a buffer tank 22 besides the vacuum pump 19 in order to facilitate control of the flow rate and pressure of the gas supplied to the torch 12.

The gas recycled from the tank 22 to the chamber 14 preferably has a constant composition to accomplish stable synthesis of the diamond. Accordingly, the gas composition is kept constant by analyzing the gas composition by a gas analyzer 23 such as a chromatograph or a mass spectrometer and operating flow rate controllers 26 of gas cylinders 25 for hydrocarbons, hydrogen and argon, respectively, to supplement the necessary gas 27 to the recycling gas.

Besides argon, hydrogen and hydrocarbon gases, an inert gas such as helium; gases of carbon compounds such as carbon monoxide, carbon halide, etc.; oxidizing gases such as oxygen, steam, etc.; gases of halogens and halogenated hydrogens may be used, whenever necessary.

After the gas composition is adjusted in this way, the recycling gas is supplied again to the plasma torch 12 through a mass flow meter 28.

Figure 1:
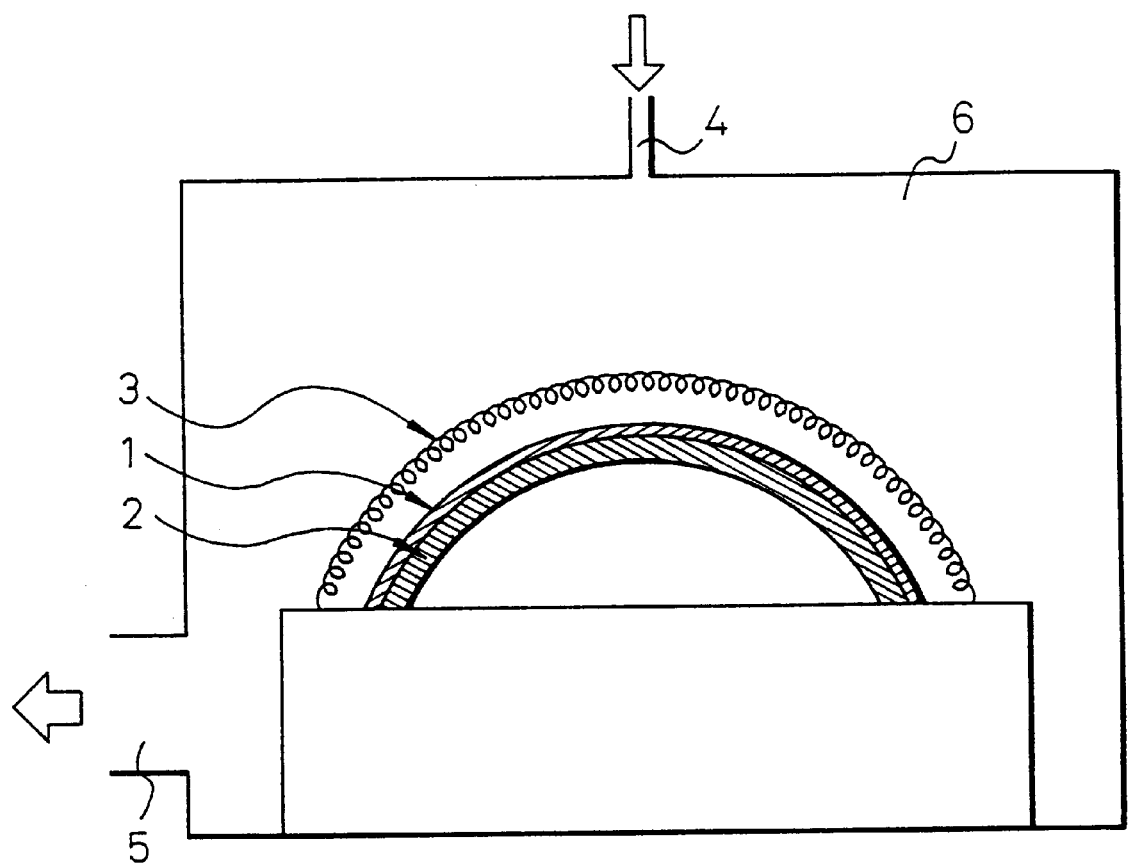
FIG. 1 shows a synthesis method of a diamond film according to the prior art.

The DC plasma jet CVD process uses greater quantities of gases than in the prior art method as shown in FIG. 1. For this reason, the cost of the gases in the film formation cost is higher. However, the quantity of the gases used can be drastically reduced by recycling the gases and by so doing, the film formation cost can be further reduced.

However, the problem encountered hereby is deposition of carbon to the anode electrode. Generally, when the hydrocarbon gas is supplied as the plasma gas between the anode and the cathode of the torch, carbon solidifies and grows on the anode surface and eventually lowers stability of discharge and deteriorates film quality. As a result of studies on this problem, the inventors of the present invention have found out that deposition of carbon can be eliminated by preventing the anodic point, at which the arc and the anode come into mutual contact, from being fixed to one point and by increasing the gas flow velocity in the proximity of this anodic point.

Figure 4A:
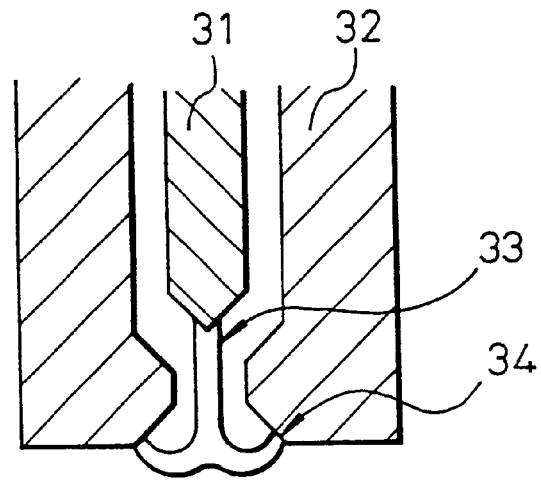
FIGS. 4A and 4B are sectional views of a plasma torch according to the prior art (shown in FIG. 4A) and to the present invention (shown in FIG. 4B)
Figure 4A:
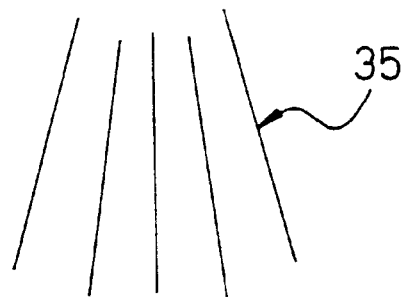
Figure 4B:
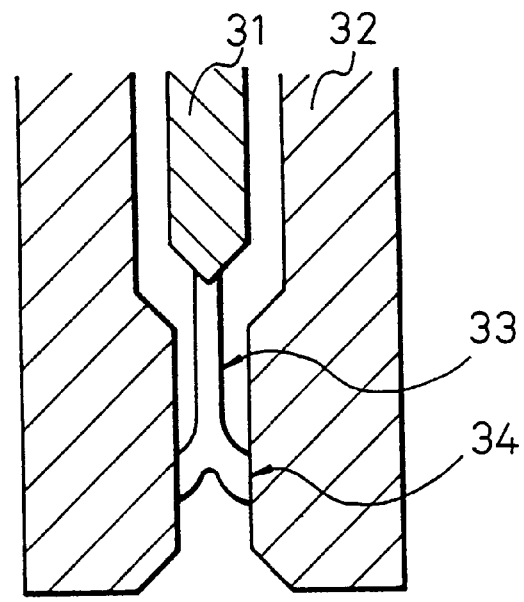
Figure 4B:
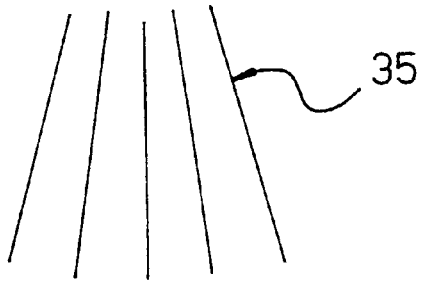
Figure 5:
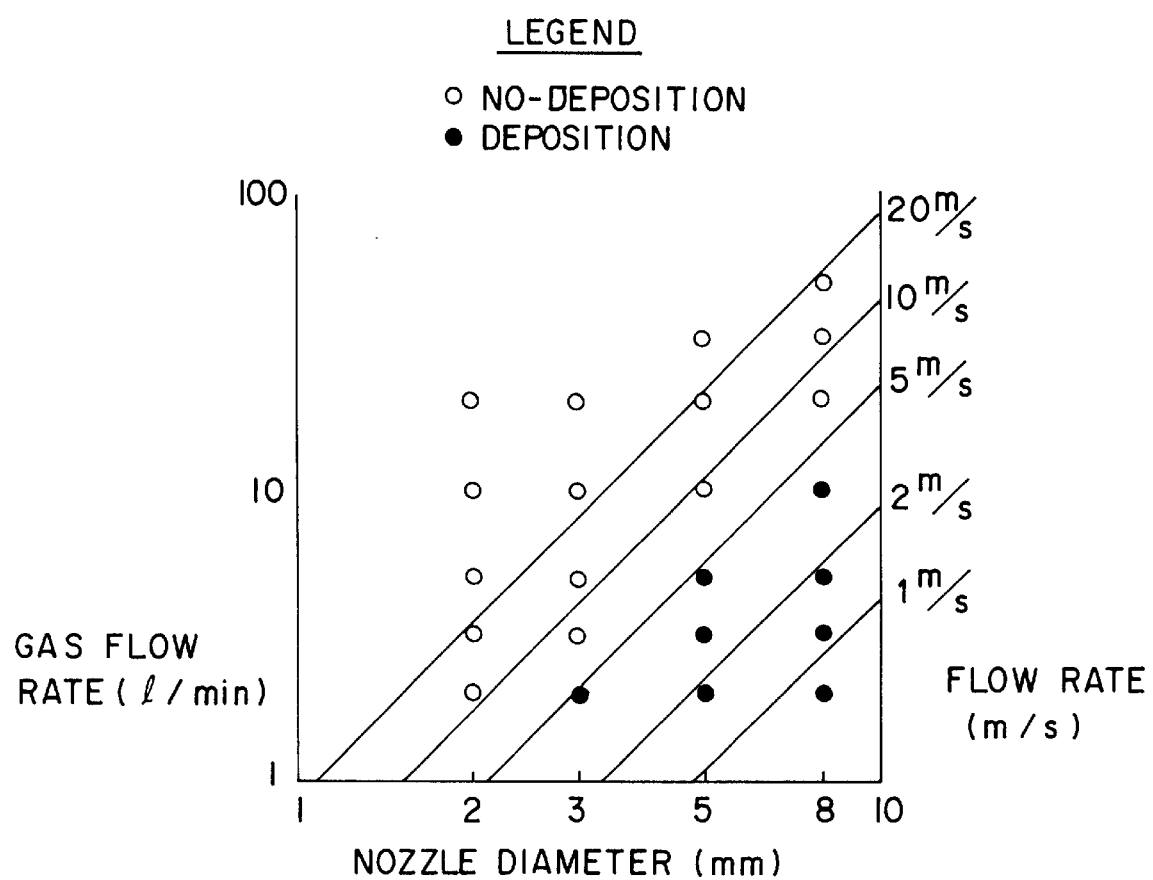
FIG. 5 is a diagram showing the correlationship between a gas velocity and carbon deposition near an anodic point of the plasma torch.

FIGS. 4A and 4B are schematic views of the torch in the present invention (FIG. 4B) and in the prior art method (FIG. 4A). In the drawings, reference numeral 31 denotes the cathode; 32 is the anode; 33 is the arc; 34 is the anodic point; and 35 is the plasma jet. According to the prior art method, the anodic point exists at a position near the nozzle of the torch at which the flow velocity of the gas is low. In contrast, in the torch according to the present invention, the anodic point exists at a position inside the torch at which the gas flow velocity is high. Accordingly, deposition of carbon is difficult to occur. Incidentally, in order to determine the gas flow velocity inside, and in the proximity of, the torch, hydrodynamical calculation in which the decomposition of the gas, ionization, temperature rises, etc., due to arc discharge are taken into consideration, is necessary. Accordingly, it is very difficult to quantitatively determine the gas flow velocity which does not permit carbon deposition. According to the result of experiments carried out by changing the nozzle diameter and the gas flow rate, it has been found that carbon deposition is difficult to occur when the mean gas flow velocity inside the nozzle is at least 5 m/s without taking the temperature rise due to discharge into account (FIG. 5). To prevent the anodic point from being fixed to one point, it is preferred to employ a method which converts the plasma gas to a turning or circulating flow and a method which applies a magnetic field to the arc, and these methods must be used positively.

Needless to say, this gas circulation method can be applied to diamond products other than the diaphragm (such as machine tools, heat-sinks, window materials, etc.), and can reduce the cost of their production

EXAMPLE 1

Figure 6:
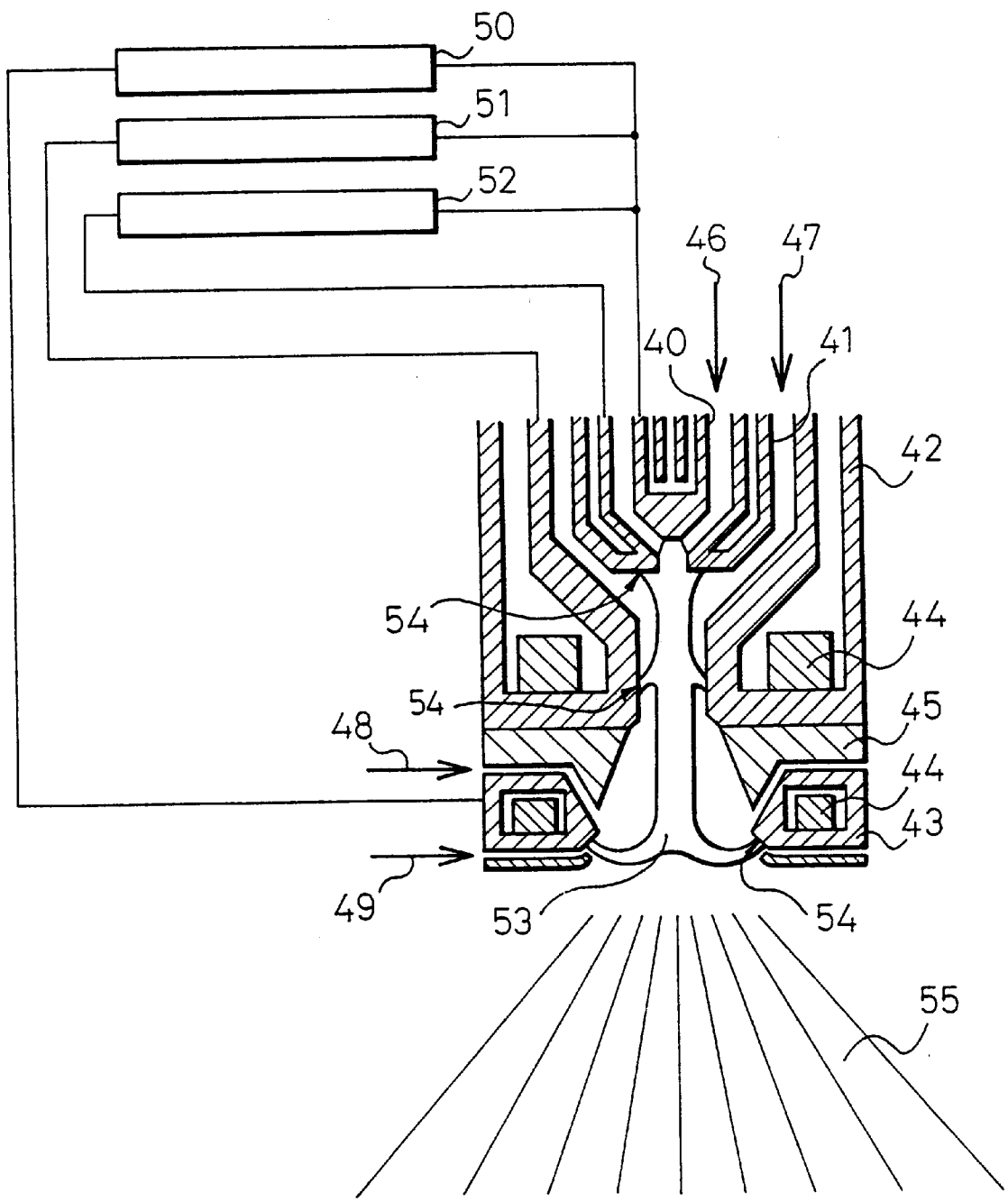
FIG. 6 is a schematic view of a DC plasma torch used in an embodiment of the present invention.
Figure 7:
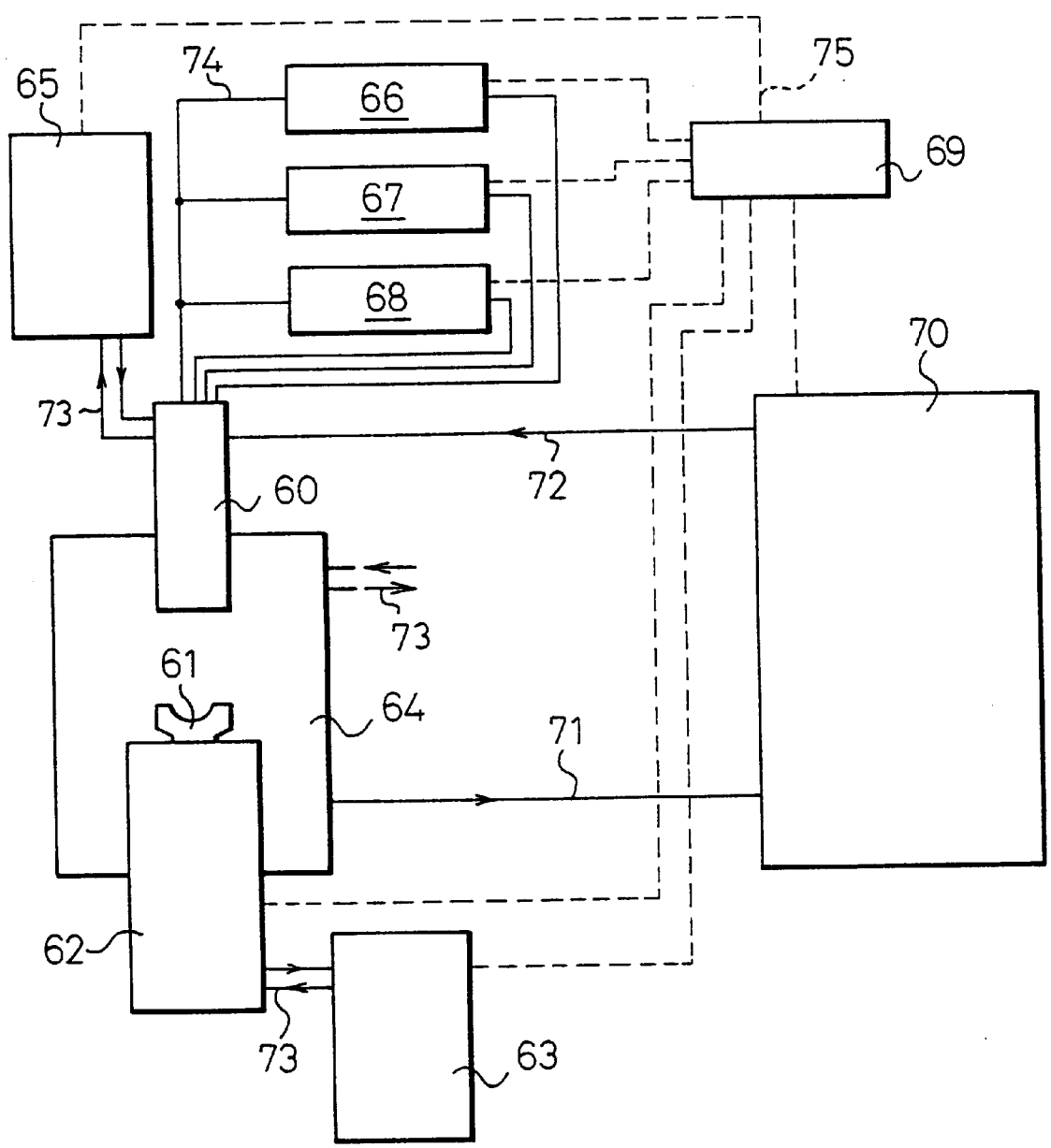
FIG. 7 is a general view of a plasma CVD apparatus used in the embodiment of the present invention.
Figure 8:
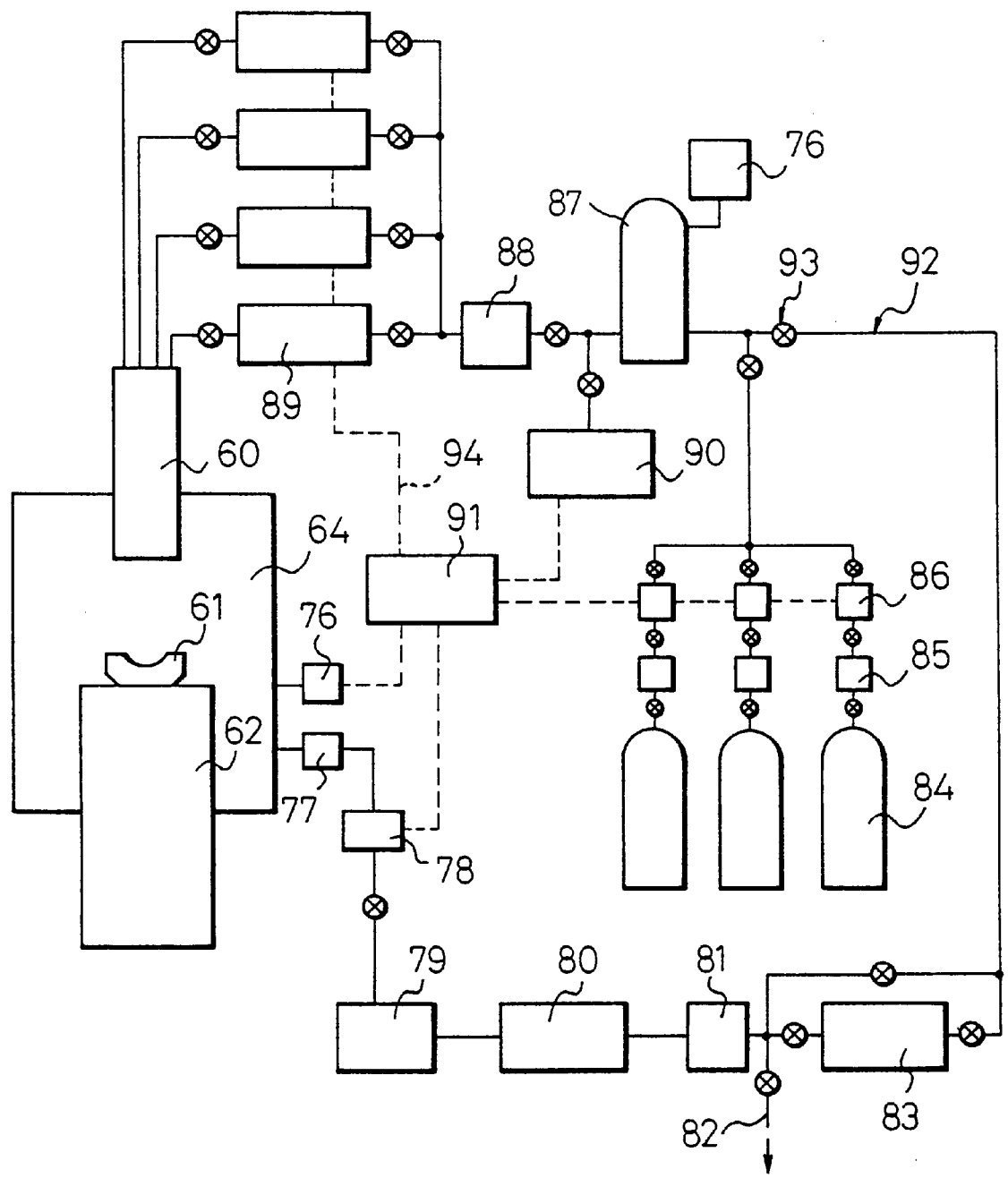
FIG. 8 is a gas system diagragm of the plasma CVD apparatus used in the embodiment of the present invention.

FIG. 6 shows a plasma torch portion of an apparatus actually used for synthesizing a diaphragm of a speaker, FIG. 7 shows the overall appearance of the apparatus and FIG. 8 shows a gas flow system thereof.

In FIG. 6, reference numeral 40 denotes a cathode; 41 is a first anode; 42 is a second anode; 43 is a third anode; 44 is a magnet; 45 is an insulator; 46 is a first plasma gas; 47 is a second plasma gas; 48 is a first shield gas; 49 is a second shield gas; 50 is a third power source; 51 is a second power source; 52 is a first power source; 53 is an arc; 54 is an anodic point; and 55 is a plasma jet.

This plasma torch is of an improved type of a triple-anode type plasma torch which was previously developed by the present inventors and could obtain a wide plasma irradiation area (Japanese Patent Application No. 5-103953), and a gas flow velocity near three anodic points was increased in order to prevent deposition of carbon. More definitely, the distal end of the first anode 41 was pointed so as to eliminate stagnation of the gas flow. The second anode 42 was thinly elongated so that the anodic point 54 existed inside the nozzle, and a shield gas 48, 49 was caused to flow at the third anodic point 54. To rotate or circulate and move the anodic point 54, the gas was converted to a spirally turning or circulating flow, and a permanent magnet 44, e.g., in the form of ring, was disposed so as to promote the rotation by the effect of the magnetic field.

In FIGS. 7 and 8, reference numeral 60 denotes a plasma torch; 61 is a substrate; 62 is a substrate rotation/movement mechanism; 63 is a substrate cooling unit; 64 is a chamber; 65 is a torch cooling unit; 66 to 68 are power sources; 69 is a data processor; 70 is a gas circulation system; 71 is an exhaust pipe; 72 is a gas pipe; 73 is cooling water; 74 is a power cable; 75 is a signal cable; 76 is a vacuum gauge; 77 is a filter; 78 is a pressure regulation valve; 79 is a mechanical booster pump; 80 is a dry vacuum pump; 81 is an oil mist trap; 82 is an external exhaust system; 83 is a compressor; 84 is a gas cylinder; 85 is a regulator; 86 is a flow rate controller; 87 is a buffer tank; 88 is a regulator; 89 is a gas flow rate controller; 90 is a gas composition analyzer; 91 is a data processor; 92 is a piping arrangement; 93 is a valve; and 94 is a signal cable.

The substrate 61 is a water cooling type substrate made of a copper and having a recess of 60 mm in diameter and 15 mm in depth. It rotates round its axis and can move up and down and in an X-Y direction (5). The chamber 64 has a water cooling type double wall structure, and its inside can be observed through a window of quartz glass.

In the gas circulation system, the first plasma gas 46, the second plasma gas 47, the first shield gas 48 and the second shield gas 49 are supplied from the chamber outlet through the dust filter 77, the pressure regulating valve 78 operating in the interlocking arrangement with a pressure gauge 76, the mechanical booster pump 79, the buffer tank 87, the regulator 88 and the gas flow controller 89, to the torch 60. A gas chromatograph 90 is mounted to the outlet of the buffer tank 87 so as to always analyze the gas composition. The gases are supplied from the gas feed systems 84 to 86 of argon, hydrogen and methane to the buffer tank 87 under the control of the data processor 91 on the basis of the data of the gas chromatograph. In this gas analysis, the concentrations of the atoms or molecules of argon, hydrogen and methane are calculated from the argon concentration, the hydrogen concentration and various hydrocarbon concentrations, and the supplementary feed of the gases is controlled on the basis of the concentrations of the above atoms.

The diamond diaphragm was produced in accordance with the following procedures using the apparatus described above.

① After the apparatus was evacuated to $10^{-3}$ torrs as a whole, argon, hydrogen and methane were supplied into the buffer tank 87 to 6 atms so that argon, hydrogen and methane attained 32%, 66% and 2% in terms of the atomic or molar concentration, respectively.

① Discharge was started at the flow rate of the first plasma gas 46 at 20 l/min, the second plasma gas 47 at 60 l/min, the first shield gas at 20 l/min and the second shield gas at 20 l/min, and the first anode (41) current at 20A, the second anode (42) current at 60A and the third anode (43) current at 40A, and the pressure regulating valve was operated so that the internal pressure of the chamber 64 attained 50 torrs.

③ After discharge became stable, the substrate 61 was brought close to the plasma torch 60 while the temperature of the copper substrate was measured by an infra-red thermometer, and synthesis of diamond was carried out at 900° C. for 20 minutes to obtain a 40 μm-thick diamond diaphragm.

④ Three minutes later from the end of discharge, the chamber was leaked, and the diamond diaphragm which had already been peeled from the substrate 61 and merely existed on the substrate, was taken out.

⑤ The upper surface and the side surfaces of the substrate 61, the inner surface of the chamber, and so on were simply cleaned. After the substrate was lowered and evacuation was made to $10^{-3}$ torrs, the procedures of the item ② et seq were repeated. In this way, the diamond diaphragm could be continuously produced.

⑥ Fins around the outer periphery of the diaphragm were cut off using a YAG laser, and the diamond diaphragm was completed.

When the frequency characteristics of a speaker for a tuitor use, produced with the diamond diaphram thus produced, were examined, a high range resonance frequency was about 35 kHz and was by far higher than that of a titanium speaker having a similar shape, i.e., 10 kHz.

The film deposition time of the diamond diaphragm was about 20 minutes, and this was 1/120 in comparison with the time for the conventional HFCVD, that is, about 40 hours. Further, since the time necessary for peeling the diamond film from the substrate could be eliminated, the time necessary for the production of the diaphragm was not greater than 1/200 of that of the conventional method. The production cost would become only one several hundredth due to the reduction of the production time, the reduction and simplification of production steps, and the disuse of auxiliary materials such as the filament. This calculation was based on the premise that the production could be carried out according to the HFCVD. It was believed extremely difficult, however, to produce the diamond diaphragm having an aperture of as great as 60 mm by the HFCVD from the aspects of the arrangement and adjustment of the filament.

EXAMPLE 2

Figure 9:
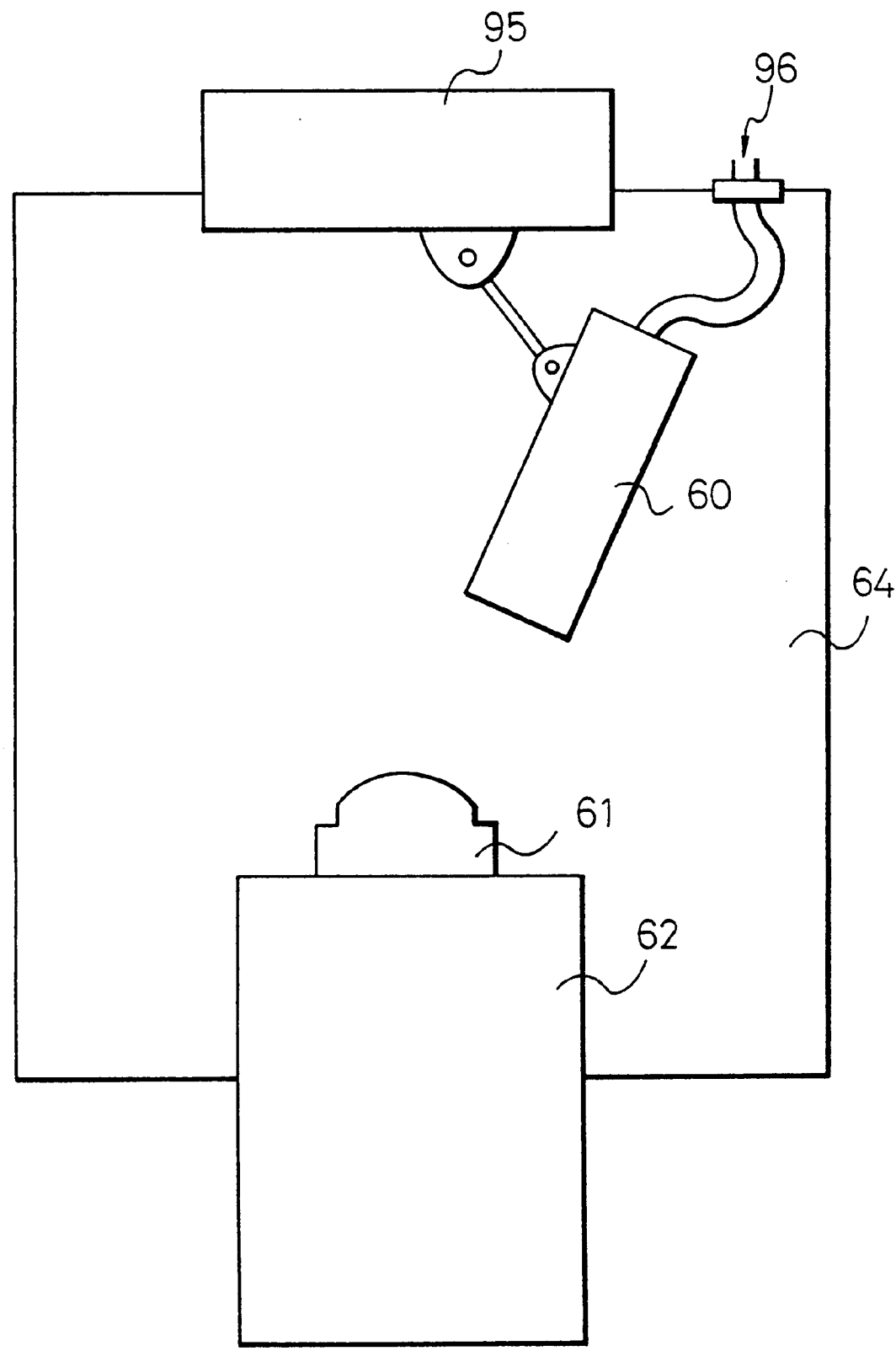
FIG. 9 shows another plasma CVD apparatus used in the embodiment of the present invention.

The substrate 61 in this embodiment was made of WC-Co and had a convexed shape so that a voice coil bobbin could be integrated. The diaphragm was produced by using an apparatus having a torch movement mechanism capable of irradiating the torch 60 from a direction inclined from the axis of the diaphragm, as shown in FIG. 9. In the drawing, reference numeral 95 denotes the torch movement mechanism, and reference numeral 96 denotes cables, piping arrangements, and so forth. By the way, the structure of the torch, the gas circulation system, the substrate rotation/movement mechanism 62, etc., were the same as those of Example 1. The convexed portion of the substrate had an aperture of 60 mm and a height of 15 mm, and the height of the voice coil bobbin was 5 mm.

① After the apparatus was evacuated to $10^{-3}$ torrs, argon, hydrogen and methane were supplied into the buffer tank 87 to 6 atms so that argon, hydrogen and methane attained 32%, 66% and 2% in terms of the atomic or molar concentration, respectively.

② Discharge was started at the flow rates of the first plasma 40 gas at 20 l/min, the second plasma gas 47 at 60 l/min, the first shield gas 48 at 20 l/min and the second shield gas 49 at 20 l/min, and the first anode (41) current at 20A, the second anode (42) current 60A and the third anode (43) current at 40A. The pressure regulating valve 78 was operated so that the internal pressure of the chamber 64 attained 50 torrs.

③ After discharge became stabilized, the substrate 61 was brought close to the torch while the temperature of the copper substrate was measured by the infrared thermometer, and synthesis of diamond was carried out at 900° C. for 20 minutes. There was thus obtained a 40 μm-thick diamond diaphragm.

Three minutes later from the end of discharge, the chamber was leaked, and the diamond diaphragm which had already peeled from the substrate and merely existed on the substrate was taken out.

④ The upper surface and the side surfaces of the substrate 61, the inner surface of the chamber 64 and so on were simply cleaned. After the substrate was lowered and evacuation was effected to $10^{-3}$ torrs, the procedures of the item ② et seq were repeated, and in this way, the diamond diaphragm could be continuously produced.

⑤ Fins around the outer periphery of the diaphragm were cut off by using a YAG laser, and the diamond diaphragm was completed.

When the frequency characteristics of a speaker for a tuitor use, produced with the diamond diaphragm thus produced, were examined, a high range resonance frequency was about 35 kHz and was by far higher than that of a titanium speaker having a similar shape, i.e., 10 kHz.

The film deposition time of the diamond diaphragm was about 20 minutes, and this was 1/120 in comparison with the time for the conventional HFCVD, that is, about 40 hours. Further, since the time necessary for peeling the diamond film from the substrate could be eliminated, the time necessary for the production of the diaphragm was not greater than 1/200 of the time for the conventional method. The production cost would become only one several hundredth due to the reduction of the production time, the reduction and simplification of production steps, and the disuse of auxiliary materials such as the filament. This calculation was based on the premise that the production could be carried out according to the HFCVD. It was believed extremely difficult, however, to produce the diamond diaphragm having an aperture of as great as 60 mm by the HFCVD from the aspects of the arrangement and adjustment of the filament.

EXAMPLE 3

A diamond diaphragm was produced using a single anode torch shown in FIG. 4B with other procedures being the same as those of Example 1.

Incidentally, the substrate was obtained by coating TiC to a thickness of 2 $\mu$m to a stainless steel, and a recess (as shown in FIG. 2) had an aperture of 30 mm and a depth of 5 mm.

① After the apparatus was evacuated to $10^{-3}$ torrs as a whole, argon, hydrogen and methane were supplied into the buffer tank (22, 87 in FIG. 3 or 8) to 6 atms so that argon, hydrogen and methane attained 33%, 66% and 1% in terms of the atomic or molar concentration, respectively.

② Discharge was started at a flow rate of a plasma gas of 40 l/min and a discharge current of 60A, and the pressure regulating valve (17, 78 in FIG. 3 or 8) was operated so that the internal pressure of the chamber (14, 64 in FIG. 3 or 8) attained 50 torrs.

③ After discharge became stabilized, the substrate (13, 61 in FIG. 3 or 8) was brought close to the torch (12, 60 in FIG. 3 or 8) while the temperature of the copper substrate was measured by the infrared thermometer, and synthesis of diamond was carried out at 900° C. for 30 minutes. There was thus obtained a 30 $\mu$m-thick diamond diaphragm.

④ Three minutes later from the end of discharge, the chamber was leaked, and the diamond diaphragm which had already peeled from the substrate and merely existed on the substrate was taken out.

⑤ The upper surface and the side surfaces of the substrate, the inner surface of the chamber and so on were simply cleaned. After the substrate was lowered and evacuation was effected to $10^{-3}$ torrs, the procedures of the item ② et seq were repeated, and in this way, the diamond diaphragm could be produced continuously.

⑥ Fins around the outer periphery of the diaphragm were cut off by using a YAG laser, and the diamond diaphragm was completed.

When the frequency characteristics of a speaker for a tuitor use, produced with the diamond diaphragm thus produced, were examined, a high range resonance frequency was about 80 kHz and was by far higher than that of titanium speaker having a similar shape, i.e., 10 kHz.

The film deposition time of the diamond diaphragm was about 30 minutes, and this was 1/60 of the conventional HFCVD, that is, about 30 hours. Further, since the time necessary for peeling the diamond film from the substrate could be eliminated, the time necessary for the production of the diaphragm was not greater than 1/100 of the time of the conventional method. The production cost would become only fractions (one several hundredth) due to the reduction of the production time, the reduction and simplification of production steps, and the disuse of auxiliary materials such as the filament.

EXAMPLE 4

A diamond diaphragm was produced by a method which used the same apparatus as used in Example 3 but supplied argon and hydrogen to the plasma torch and methane, as the atmospheric gas, without effecting gas circulation.

① After the apparatus was evacuated to $10^{-3}$ torrs as a whole, argon at a flow rate of 10 l/min and hydrogen at a flow rate of 10 l/min as the plasma gas and methane at a flow rate of 0.3 l/min as the atmospheric gas were caused to flow, and discharge was started at a discharge current of 60A. The pressure regulating valve 18, 78 was operated so that the internal pressure of the chamber attained 50 torrs.

② After discharge became stabilized, the substrate was brought close to the torch while the temperature of the copper substrate was measured by the infrared thermometer, and synthesis of diamond was carried out at 900° C. for 30 minutes. There was thus obtained a 30 $\mu$m-thick diamond diaphragm.

③ Three minutes later from the end of discharge, the chamber was leaked, and the diamond diaphragm which had already peeled from the substrate and merely existed on the substrate was taken out.

④ The upper surface and the side surfaces of the substrate, the inner surface of the chamber and so on were simply cleaned. After the substrate was lowered and evacuation was effected to $10^{-3}$ torrs, the procedures of the item ② et seq were repeated, and in this way, the diamond diaphragm could be produced continuously.

⑤ Fins around the outer periphery of the diaphragm were cut off by using a YAG laser, and the diamond diaphragm was completed.

When the frequency characteristics of a speaker for a tuitor use, produced with the diamond diaphragm thus produced, were examined, a high range resonance frequency was about 80 kHz and the characteristics were equal to those in Example 3.

The production time of the diamond diaphragm was below 1/100 of the thermal filament method in the same way as in Example 2, but because the gas consumption quantity was great, the production cost was about four times that of Example 2. Nonetheless, this value was only (one several handredth) of the cost of the thermal filament method.

The production method of the diamond diaphragm according to the present invention can reduce the production time as well as the production cost to a few percents or one tenth of a few percents of the conventional HFCVD, and moreover, can produce a diaphragm having such a large diameter which could not have been produced by the HFCVD.

What is claimed is:

1. A method for producing a shaped diamond film which comprises:

preparing a shaped substrate having a surface portion thereof composed of a material, which does not react with carbon and which has a different thermal expansion coefficient than the diamond film, said material being a ceramic material or a metal selected from the group consisting of copper, platinum, gold and alloys thereof;

depositing a diamond film onto the shaped substrate from a mixed gas, which contains hydrogen, a carbon-containing gas and an inert gas, by a DC plasma jet CVD process so as to deposit said diamond film at a rate of at least 30 $\mu$m per 30 minutes; said mixed gas being at a constant pressure and said hydrogen, carbon-containing and inert gases being provided at a constant flow rate;

recycling the mixed gas, the composition of which is maintained constant by the addition of hydrogen, the carbon-containing gas and the inert gas; wherein the flow rate of the recycled mixed gas in proximity to the anodic point of the plasma torch is at least 5 m/s;

cooling the shaped substrate, whereby the diamond film deposited on the shaped substrate separates from the shaped substrate; and removing the shaped diamond film from the shaped substrate.

2. A method according to claim 1, wherein the method is repeated using the same shaped substrate.

3. A method according to claim 1, wherein the ceramic material is tungsten carbide, titanium carbide or titanium nitride.

4. A method for producing a shaped diamond film which comprises:

preparing a shaped substrate having a surface portion thereof composed of a material, which does not react with carbon and which has a different thermal expansion coefficient than the diamond film, said material being a ceramic material or a metal selected from the group consisting of copper, platinum, gold and alloys thereof;

depositing a film onto the shaped substrate from a mixed gas, which contains hydrogen, a carbon-containing gas and an inert gas, by a DC plasma jet CVD process using a plasma torch having an anode; said mixed gas being at a constant pressure and said hydrogen, carbon-containing and inert gases being provided at a constant flow rate;

recycling the mixed gas, the composition of which is maintained constant by the addition of hydrogen, the carbon-containing gas and the inert gas; wherein the flow rate of the recycled mixed gas in proximity to the anodic point of the plasma torch is at least 5 m/s so as to reduce deposition of carbon onto a surface of the anode of the plasma torch;

cooling the shaped substrate, whereby the diamond film deposited on the shaped substrate separates from the shaped substrate; and removing the shaped diamond film from the shaped substrate.

5. A method according to claim 4, wherein the method is repeated using the same shaped substrate.

6. A method according to claim 4, wherein the ceramic material is tungsten carbide, titanium carbide or titanium nitride.

* * * * *